(12) United States Patent
Yang et al.

(10) Patent No.: US 8,404,432 B2
(45) Date of Patent: Mar. 26, 2013

(54) LITHOGRAPHY PROCESS

(75) Inventors: XiaoMin Yang, Sewickley, PA (US);
Shuaigang Xiao, Cranberry Township, PA (US)

(73) Assignee: Seagate Technology LLC, Cupertino, CA (US)

(*) Notice: Subject to any disclaimer, the term of this patent is extended or adjusted under 35 U.S.C. 154(b) by 954 days.

(21) Appl. No.: 11/824,124

(22) Filed: Jun. 29, 2007

(65) Prior Publication Data
US 2009/0004609 A1    Jan. 1, 2009

(51) Int. Cl.
*G03F 7/20* (2006.01)
(52) U.S. Cl. .......................... 430/322; 430/394
(58) Field of Classification Search .................. 430/394, 430/311, 313, 322, 326, 328
See application file for complete search history.

(56) References Cited

U.S. PATENT DOCUMENTS

| | | | |
|---|---|---|---|
| 6,556,933 B1 | 4/2003 | Sacks et al. | |
| 6,576,113 B1 | 6/2003 | Scherer et al. | |
| 6,643,082 B1 | 11/2003 | Belser | |
| 6,738,207 B1 | 5/2004 | Belser et al. | |
| 7,161,755 B1 | 1/2007 | Benakli et al. | |
| 2002/0034666 A1 | 3/2002 | Kiely | |
| 2003/0102285 A1* | 6/2003 | Nozaki et al. | 216/41 |
| 2003/0211422 A1* | 11/2003 | Yip et al. | 430/296 |
| 2003/0234470 A1 | 12/2003 | Haan et al. | |
| 2005/0140957 A1* | 6/2005 | Luijkx et al. | 355/71 |
| 2005/0157597 A1 | 7/2005 | Sendur et al. | |
| 2005/0271819 A1 | 12/2005 | Wago et al. | |
| 2006/0003270 A1* | 1/2006 | Hoshika | 430/325 |
| 2008/0008967 A1* | 1/2008 | Chang et al. | 430/311 |
| 2008/0131820 A1* | 6/2008 | Van Steenwinckel et al. | 430/325 |

FOREIGN PATENT DOCUMENTS

WO    WO 2006-025760    * 3/2006

OTHER PUBLICATIONS

English translation of WO 2006-025760, Mar. 2006.*

* cited by examiner

*Primary Examiner* — Brittany Raymond

(57) ABSTRACT

A lithography process for manufacturing bit-island storage mediums that results in improved resolution and uniformity between bit-islands. The lithography process includes applying a resist coating polymer to a surface of a substrate. Selected areas of the resist coating polymer are then exposed to an energy source, wherein each selected area is exposed to the energy source multiple times to provide a time-averaged exposure of the selected areas that reduces errors caused by noise associated with the energy source. After exposure of the resist coating to the energy source, a selective developer solution is applied to the resist coating to develop the fully exposed regions of the resist coating while leaving undeveloped the partially exposed regions of the resist coating. A polymer reflow material is applied to the developed resist pattern and heated to a selected temperature. The polymer reflow material and selected temperature induce reflow of the developed resist coating such that such that a circumferential diameter associated with the holes formed in the resist pattern is reduced to a desired value distance. The process of inducing reflow of the resist coating can be repeated as desired to achieve a resist pattern wherein the holes formed in the resist pattern are reduced to a desired size. The resist pattern formed on the substrate is then transferred to a magnetic medium to form the desired pattern of bit-islands.

18 Claims, 6 Drawing Sheets

LITHOGRAPHY PROCESS

FIELD OF THE INVENTION

The present invention is related to a lithography process, and in particular to a lithography process for bit patterned media.

BACKGROUND

Traditional magnetic storage media, such as those employed in disc drives, are essentially uniform and continuous. The density with which data can be written is constrained by the superparamagnetic limit. A solution to overcoming the constraints of the superparamagnetic limit is to organize the magnetic media into a series of individual islands. A benefit of this structure is the increase in a real density that can be achieved over traditional media. However, because the bit islands are discrete, writing data to the disc requires knowledge of the location of each bit island. Therefore, the uniform fabrication of the bit islands is important to providing a high-quality storage medium.

Fabrication of bit-patterned media presents a number of challenges not present in fabrication of conventional media. In particular, there are three factors that define the performance associated with bit-patterned media. The first is reducing the variation between bit islands, such that the sigma or difference associated with the size and shape of each of the bit islands is very low. That is, the bit islands should be uniform in size and shape. The second is reducing the size of each of the bit islands (uniformly) to increase areal density that can be obtained. The third is reducing the pitch (i.e., the distance between adjacent bit islands) to increase the areal density.

SUMMARY

In one aspect, the invention is directed towards a method of fabricating a template. The method includes applying a resist coating to a substrate and exposing selected locations of the resist coating to an energy source at successive intervals to provide a time-averaged exposure of the selected locations.

In another aspect, the invention is directed towards a method of fabricating a template. A resist coating is applied to a substrate, and selected locations of the resist coating are exposed to an energy source. Following exposure of the resist coating, a selective development solution is applied to the template. The selective development solution is selected based on a desired development rate such that fully exposed regions of the resist coating are developed while leaving undeveloped the partially exposed regions of the resist coating.

In another aspect, the invention is directed towards a method of fabricating a template. A polymer reflow material is applied to a template that includes a substrate and a developed resist pattern. The polymer reflow material is heated to induce reflow of the developed resist pattern such that the circumferential diameter of the bit-islands are reduced in size.

In another aspect, the present invention is directed towards a method of fabricating a bit-island storage medium. A resist coating polymer is applied to a surface of a substrate. Selected portions of the resist coating polymer are exposed to an energy source at successive intervals to provide a time-averaged exposure of the selected locations. The resist coating polymer is developed using a selective development solution that only develops fully exposed areas of the resist coating polymer, wherein developing only the fully exposed areas of the resist coating polymer results in the formation of well-defined holes. A polymer reflow material is applied to the developed resist coating polymer. The developed resist coating polymer coated with the polymer reflow material is baked to induce reflow of the developed resist coating polymer such that a circumferential diameter associated with the holes is reduced to a desired value distance. The substrate is rinsed to remove the remaining polymer reflow material from the substrate, and the pattern defined by the remaining resist coating polymer is transferred to a bit-island magnetic medium.

DETAILED DESCRIPTION

Figure 1:
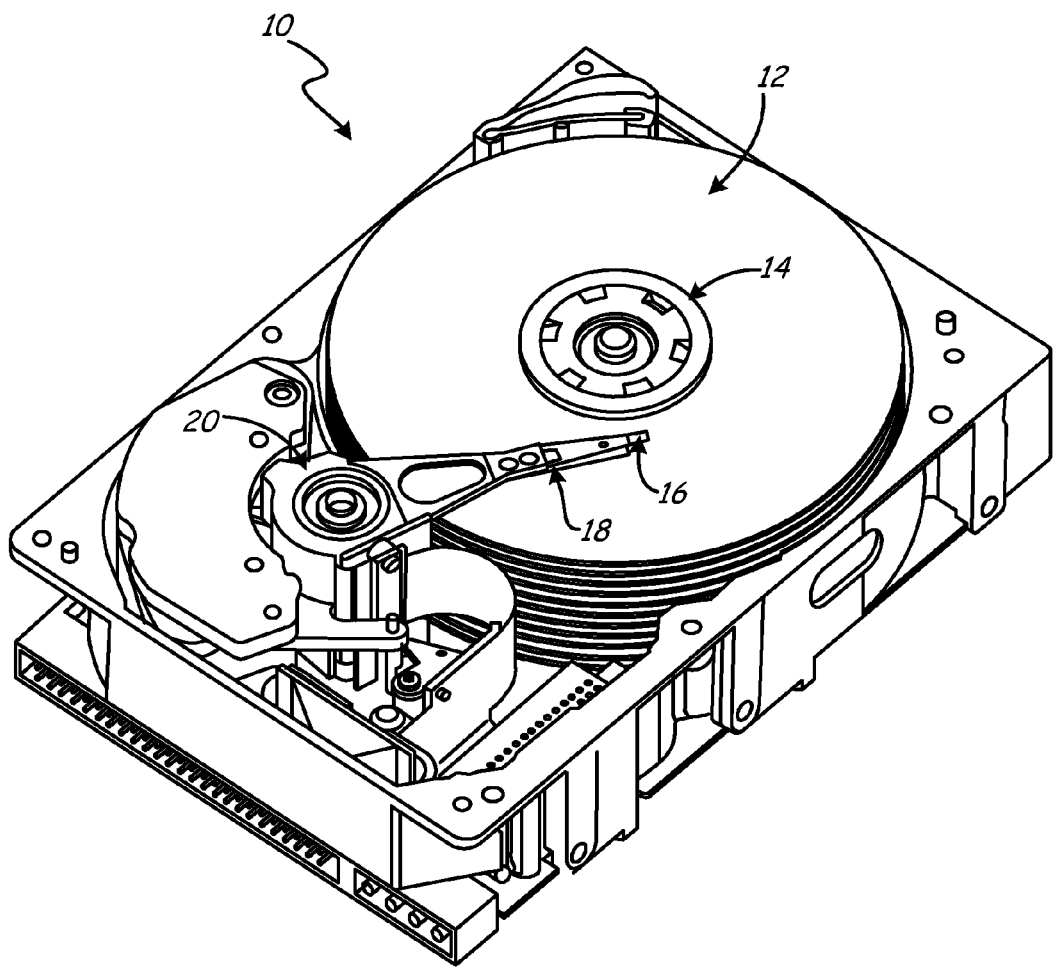
FIG. 1 is a perspective view of a disc drive system.

FIG. 1 is a perspective view of a disc drive 10 in which an embodiments of the present invention may be employed. Disc drive 10 includes disc pack 12, spindle 14, disc head slider 16, actuator 18, and voice coil motor 20. Disc pack 12 includes one or more individual discs that are rotated about a central axis by spindle 14. In one embodiment, the individual discs are fabricated using a lithography process described below with respect to FIGS. 2-5 that organizes individual bit-islands of magnetic media for storage of data, commonly known as "bit-patterned media". Data is written to and read from the individual discs by disc head slider 16, wherein each individual disc would be accompanied by an individual disc head slider. The disc head slider is positioned over individual tracks of each disc by actuator 18 and voice coil motor 20. In this way, as spindle 14 rotates the discs, voice coil motor 20 and actuator 18 position the disc head slider 16 over a desired track, such that data can be written to or read from the disc.

Figure 2:
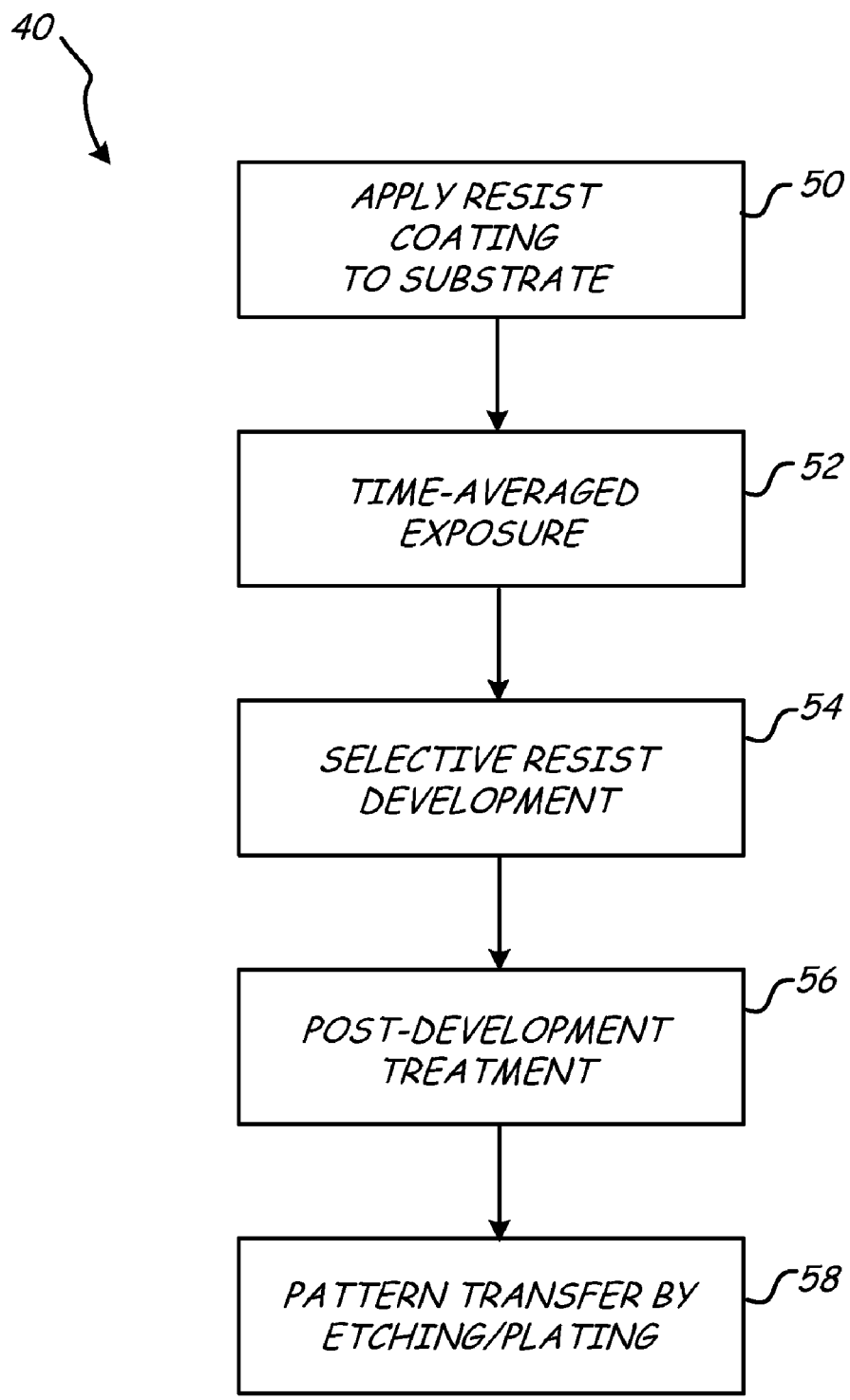
FIG. 2 is a flowchart illustrating fabrication process for generating bit-patterned media.

FIG. 2 illustrates one embodiment of steps performed in lithography process 40 used to improve size, pitch, and sigma reduction in fabricating high-resolution dots or bit islands. Lithography process 40 includes substrate pretreatment and resist coating at step 50, electron beam ("e-beam") exposure at step 52, selective resist development at step 54, post-development treatment at step 56, and pattern transfer at 58. Lithography process 40 results in the generation of a high-quality template that can be transferred to magnetic media, such as the discs shown in FIG. 1.

Pretreatment and resist coating (step 50) includes applying a resist coating to a substrate. The resist coating should be applied in a uniform matter over the substrate, and may make use of any well-known processes for depositing the resist coating. Exposure of the resist coating at step 52 is a process by which the pattern (in this case, the bit-island pattern) is selectively formed in the resist coating. In one embodiment, the exposure process is formed with an electron beam (e-beam). Applying an e-beam or similar energy source to a resist coating (not shown) has the effect of changing the state of the resist coating. For example, as discussed in more detail with respect to FIG. 4, e-beam exposure causes the chain scission in the original molecules that reduces the chain length and weight of the molecules. In this way, select areas of the resist coating are differentiated from adjacent areas by application of an e-beam.

In particular, both the pitch size and variation associated with the bit-islands is dependent, in part, on how accurately and precisely the e-beam exposure can be applied to the resist coating. In particular, as described in more detail with respect to FIG. 3, time-averaged electron beam exposure 52 is a process by which the electron beam is applied a number of times to each area representing a bit island. This is in contrast with the traditional method of e-beam exposure wherein each bit island is exposed to the e-beam a single time. One of the benefits of writing a bit island a number of times is errors (e.g., noise associated with the e-beam) associated with the writing of each bit island are averaged through successive write operations, resulting in a bit island exposure that results in a reduction in variation between bit islands and allows for a reduction in pitch size.

At step 54, the resist area exposed by the e-beam is selectively developed. In particular, as described in more detail with respect to FIG. 4, in one embodiment this process step includes selecting a developer with a controlled developer rate that develops areas fully exposed to the electron beam, but not areas partially exposed to the electron beam. Selective development allows for a reduction in pitch size and sigma between bit islands with respect to conventional development processes.

At step 56, a post-development treatment is applied to the substrate and remaining resist. In particular, in one embodiment of the post-development treatment, shown in more detail with respect to FIG. 6, a shrink material is deposited onto the substrate and baked. A benefit of this process is that the bake process induces the remaining resist coating (i.e., the resist coating not developed at step 54) to reflow and thereby reduces the diameter of the holes between resist patterns. The deposits of the shrink material and subsequent bakes may be performed a number of times until the size of the bit islands are satisfactory. The net result of reducing the diameter of the holes between the resist pattern is that the size of the bit islands is reduced when the pattern is transferred to the magnetic media at step 58. There are a number of well known methods of transferring a pattern from a substrate with developed resist to another media, such as by etching the pattern onto the other media or by a plating process in which the pattern is transferred to another media.

Therefore, lithography process 40 describes a method of generating a bit-pattern design that reduces the size and pitch of the bit islands, as well as the variation associated with each bit islands. FIGS. 3-6 illustrate in more detail some of the process steps associated with lithography process 40.

Figure 3:
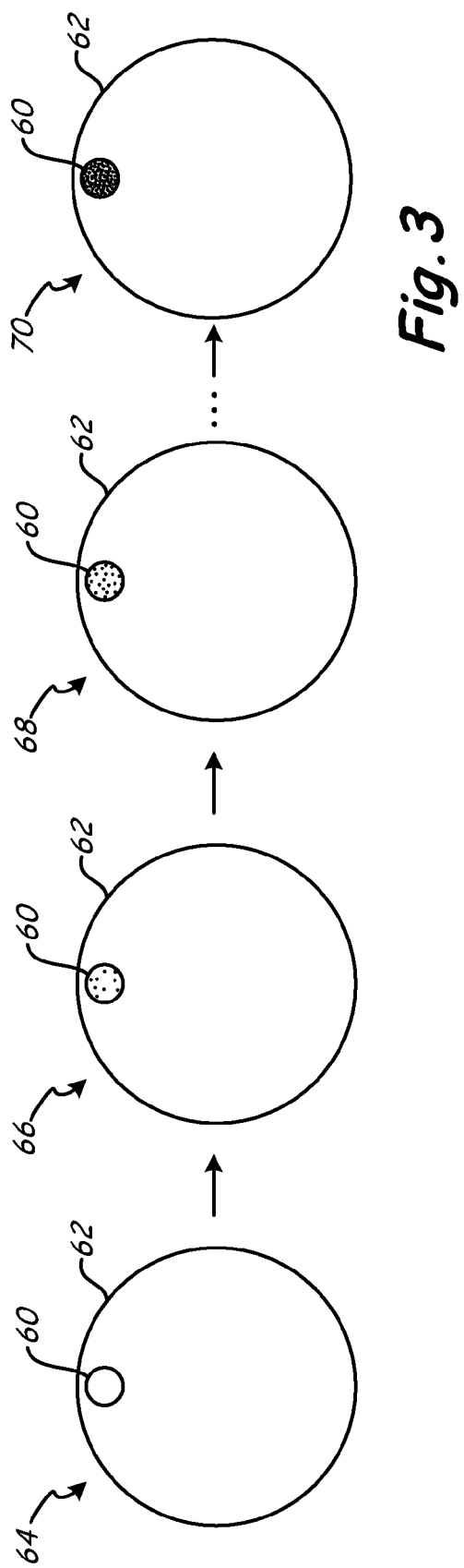
FIG. 3 is a diagram illustrating a time-averaged writing step associated with the fabrication process shown in FIG. 2

In particular, FIG. 3 illustrates in more detail the time-averaged write scheme described with respect to step 52. In particular, FIG. 3 illustrates the writing or exposure of a single bit island 60 on template 62 with successive passes of an e-beam. It is important to note that the size and sigma (variation) associated with each bit island on a bit patterned media is dependent on the accuracy of the e-beam. However, e-beams include associated signal to noise (SNR) ratios as a function of time that tend to introduce errors into writing with the electron beam. In particular, if the time period of noise associated with the electron beam is comparable to the writing time for a single bit-island then errors will be introduced associated with the size and shape of the bit-island.

As shown in FIG. 3, errors associated with variations in the size and shape of bit islands may be reduced by applying the e-beam multiple times to each location 60 representing a bit island (i.e., a resist pattern structure which when transferred to a magnetic media will represent a bit-island) to be formed in the resist coating. For instance, in forming a bit island pattern for a rotary or circumferential medium, an e-beam is applied to location 60 at a first time (step 64). The template 62 is rotated and then the e-beam is applied to the same bit-island location 60 at a second time (step 66). The template 62 is rotated again and the e-beam is applied to the same bit-island location 60 at a third time (step 68). This process continues for N cycles (step 70), resulting in a single bit-island location being written N times by the e-beam. In one embodiment, the number N of times the dot location is written must be must larger than 1 in order to offset the effect of noise from the e-beam (e.g., N>>10). In addition, in one embodiment the time intervals between successive writes of the same dot or bit island are much larger than the writing time, thereby minimizing the effects of e-beam noise.

Although in the embodiment shown in FIG. 3, an e-beam is applied to a rotary medium, in other embodiments the e-beam could be used to expose any variety of medium shapes. In addition, although e-beam lithography is described throughout this application, other well known types of lithography may be employed, such as nano-imprint lithography, deep ultraviolet lithography (DUV), extreme ultraviolet (EUV) lithography, and ion-beam lithography. As with e-beam lithography, these other methods of lithography would include successive exposure of the resist coating to the energy source over a defined time interval to average out errors in the energy source.

Figure 4:
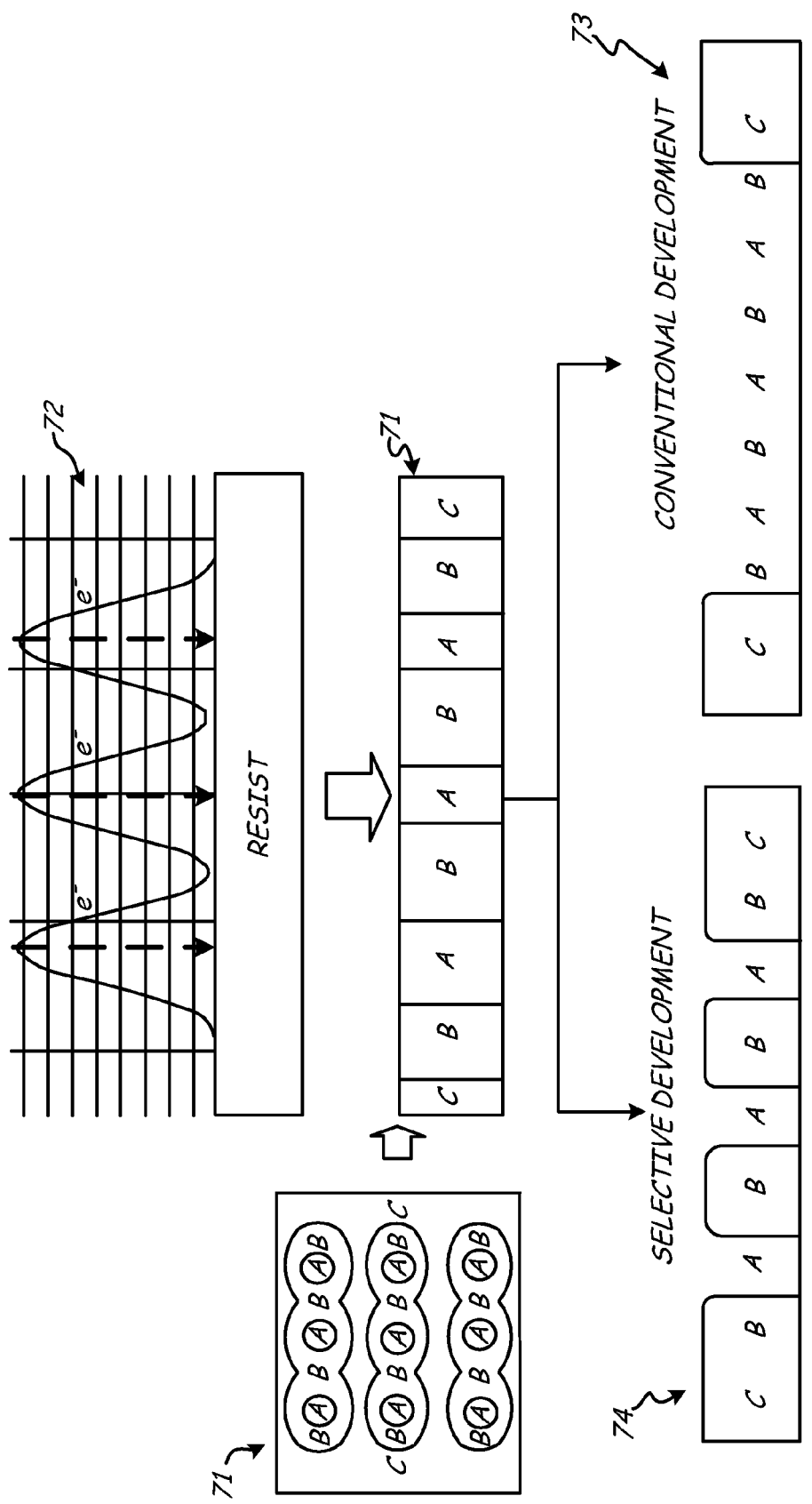
FIG. 4 is a diagram illustrating a selective development step associated with the fabrication process shown in FIG. 2.

FIG. 4 illustrates in more detail the selective development of the resist material described with respect to step 54. The concept illustrated with respect to FIG. 4 is the ability to selectively develop areas exposed to the e-beam (or other lithographic energy source) based on the selection of development solvent that only develops or removes fully exposed regions of the resist coating, while leaving partially exposed regions.

FIG. 4 shows a top-view of resist coating 71 with shaded regions illustrating the location and magnitude of e-beam writes into the resist coating to form a desired pattern. Resist coating 71 includes three areas, those areas fully exposed to the e-beam (labeled 'A'), those areas partially exposed to the electron beam (labeled 'B'), and those areas unexposed to the electron beam (labeled 'C'). In addition, a side-view of the resist coating 71 is also shown to the right of the top-view. The location of e-beam writes to resist coating 71 is shown by the Gaussian distribution 72 located directly above the side-view of resist coating 71, wherein the magnitude of the e-beam write with respect to resist coating 71 is illustrated by comparing the Gaussian distribution 72 to the side-view of the resist coating 71. As illustrated by this view, the areas fully exposed (i.e., the areas corresponding to the highest magnitude of the e-beam or alternative energy source) are labeled 'A', the areas partially exposed (i.e., the areas corresponding to a lower magnitude of the e-beam or alternative energy source) are labeled 'B', and areas not exposed at all to an energy source are labeled 'C'.

The effect of applying a conventional development solvent to resist coating 71 is shown by the side view of conventionally developed resist coating 73. This pattern illustrates that conventional solvents result in the development or removal of all resist material exposed, whether partially or fully, to the electron beam. The shape/edge roughness of each bit-island depends not only on the shape control and error minimization of the e-beam writing (discussed above with respect to FIG. 3), but also on the amplification of edge roughness caused by resist development. Hence, a conventional resist developer will amplify the dot edge roughness created during e-beam exposure due to the quantum effect (i.e., limited number of electrons projected per dot) and poor selectivity of the regions exposed to varying amounts of e-beam energy. That is, regions exposed only partially to the e-beam will be developed along with regions exposed fully to the e-beam, without discretion.

The effect of applying a selective development solvent to resist coating 71 is shown in the side view of selectively developed resist coating 74. In this view, we see that by selecting a developer with a controller develop rate, only the fully exposed areas of the resist coating are developed, leaving the partially exposed areas of the resist coating.

The ability to selectively develop only the fully exposed regions is due to, in on embodiment, the reduction of molecular weight caused by the chain scission of the original molecules as a result of a positive electron resist. That is, in the fully exposed areas (labeled area 'A') the polymer chains break down into shorter segments having a lower molecular weight and therefore better solubility in most organic solvents than the original molecules. The short chain segments residing in fully exposed areas (labeled 'A') can be developed by choosing a solvent that is a good solvent of short segments and non-solvent for the resist (longer segments). In particular, the molecular weight associated with particles located in the fully exposed areas is less than the molecular weight associated with particles located in partially exposed areas (i.e., molecular weight of polymer chains in area 'A' are smaller than the molecular weight of polymer chains in area 'B'). A proper developer having a controlled develop rate will result in the full development of material in area 'A' (i.e., removal of exposed material in area 'A'), but will not develop the material located in area B.

In one embodiment, the development rate is decreased as desired to minimize the development of partially exposed areas by using a weak solvent (that is, a weak solvent of the resist coating for positive-tone resist or a strong solvent for negative-tone resist). In another embodiment, the temperature employed for a positive-tone resist is lowered to control the development rate (or in the alternative, the temperature employed for a negative-tone resist is increased). A benefit of the selective development process is the ability to develop regular-shape (e.g., rounded in a dot pattern) inner region in a dot area exposed to an e-beam while the irregular-shaped outer region formed mainly by noise associated with the e-beam is not developed.

In one embodiment, for positive resist materials, a weak or poor developer such as water, isopropanol, ethanol, or other similarly weak solvents are applied to control the development rate. That is, only the low-molecular weight, highly fragmented resist molecules in the fully exposed regions (i.e., area 'A') are developed, leaving a smoothly and well-shaped hole. For negative resist materials, a strong or harsh developer such as KOH, NaOH, high-concentration TMAH aqueous solution, or other similar solvents are applied, which will remove low-molecular weight, partially cross-linked resist molecules in the outer region of a fully exposed region to define a sharp and well-shaped dot structure.

In addition to varying the type of developer solvent employed in the selective resist step, both the development temperature and development time may be varied to control the development rate and thereby selectively control the material developed or removed as part of the development process. For example, by selectively controlling the development rate (either by selection of the developer solvent, development temperature, or development time), the removal of resist material can be selectively controlled such that bit-islands of a defined size are found, and with little variation. Thus, the development process itself can be used to control the size of the bit-islands.

Figure 5A:
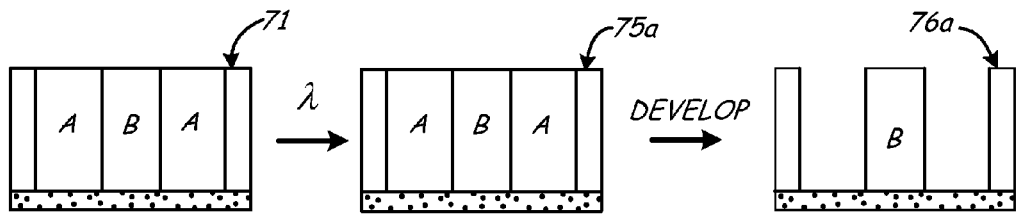
FIGS. 5A-5C are diagrams illustrating examples of an inducement step to improve the development step shown in FIG. 4.
Figure 5B:
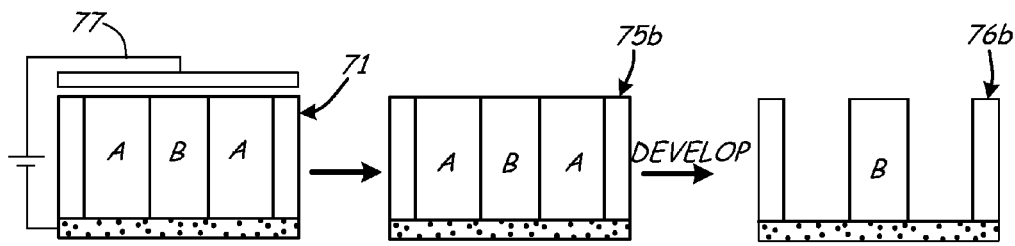
Figure 5C:
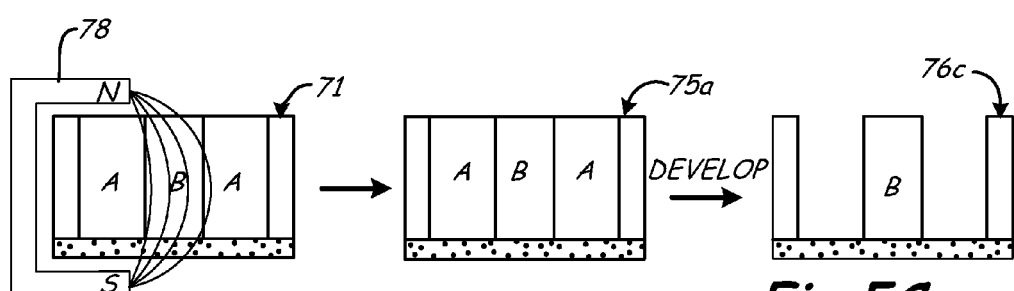

In addition, FIGS. 5A-5C illustrate additional steps that may be utilized in conjunction with the selective development process shown in FIG. 4 to further enhance the differentiation between areas fully exposed and areas partially exposed to the e-beam energy source. Each embodiment shown in FIGS. 5A-5C act to induce additional cross-linking in areas partially exposed to the e-beam such that the differentiation between the fully exposed regions and the partially exposed regions is increased. This, in turn, improves the development of the resist coating as discussed with respect to FIG. 4.

FIG. 5A illustrates one embodiment of an inducement process that may be used to induce additional differentiation in the cross-linking between fully exposed regions and partially exposed regions. In this embodiment, light having a particular wavelength is applied to resist coating 71. Due to differences in the chain length and molecular weight between the polymer chains in regions fully exposed (area 'A') and regions partially exposed (area 'B'), the regions react differently to the light applied at wavelength B. As illustrated by induced cross-linked resist coating 75a, the wavelength of the light induces additional cross-linking of polymer chains in the partially exposed region (area 'B'), but not in the fully exposed regions (area 'A'). In this way, differentiation in the cross-linking and molecular weights of fully exposed regions (areas 'A') and partially exposed regions (area 'B') is increased such that the development process provides improved resolution of developed resist coating 76a.

FIG. 5B illustrates another embodiment of an inducement process that may be used to induce additional differentiation in the cross-linking between fully exposed regions and partially exposed regions. In this embodiment, electrical system 77 is used to generate an electric field throughout resist coating 71. Once again, due to the differences in the chain length and molecular weight between the polymer chains in regions fully exposed (area 'A') to the e-beam as compared to regions partially exposed to the e-beam (area 'B'), the polymer chains in each region exhibit a different reaction to the electric field. As shown by induced cross-linked resist coating 75b, the electric field generated by electrical system 77 induces cross-linking among the polymer chains in partially exposed regions (area 'B') but no additional cross-linking in fully exposed regions (area 'A'). The net result is the increase in differentiation between fully exposed regions and partially exposed regions, which once again aids in the selective development process in generating developed resist coating 76b.

FIG. 5C illustrate another embodiment of an inducement process that may be used to induce additional differentiation in the cross-linking between fully exposed regions and partially exposed regions. In this embodiment, magnetic system 78 is used to generate a magnetic field throughout resist coating 71. Once again, differences in the chain length and molecular weight between the polymer chains in regions fully exposed (area 'A') to the e-beam as compared to regions partially exposed to the e-beam (area 'B'), the polymer chains in each region exhibit a different reaction to the magnetic field. As shown by induced cross-linked resist coating 75c, the magnetic field generated by magnetic system 77 induces cross-linking among the polymer chains in partially exposed regions (area 'B') but no additional cross-linking in fully exposed regions (area 'A'). In regions fully exposed (area 'A'), the magnetic field does not induce any substantial cross-linking. The net result is the increase in differentiation between fully exposed regions and partially exposed regions, which once again aids in the selective development process in generating developed resist coating 76c.

Figure 6:
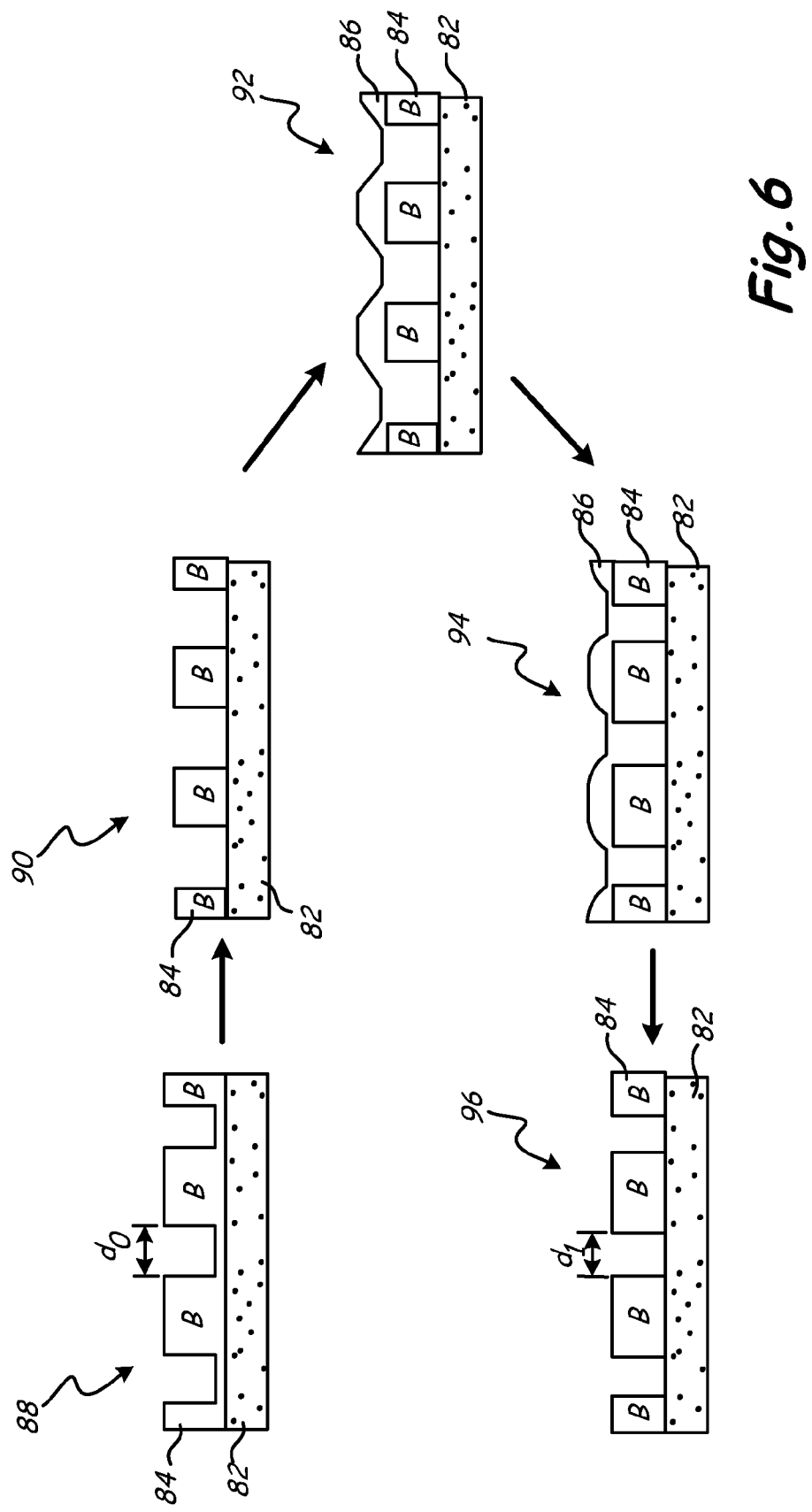
FIG. 6 is a diagram illustrating a thermal reflow shrinkage step associated with the fabrication process shown in FIG. 2.

FIG. 6 illustrates an embodiment of a post-development treatment process, as applied to template that includes substrate 82, and resist coating 84. In the embodiment shown in FIG. 6, the process begins with a template that has been exposed and developed as shown at step 88. In one embodiment, the template has been exposed and developed using the processes described with respect to FIGS. 3 and 4. In other embodiments, other methods may be employed to create a template with a developed resist coating. At this point, the circumferential diameter associated with the holes (i.e., the structures that will eventually dictate the size of bit-islands when transferred to the magnetic medium) is labeled $d_o$. Steps included in the post-development treatment process include a reactive ion etch process at step 90 that removes remaining resist coating material 84 from the bottom of each hole, application of a polymer reflow material 86 over the surface of substrate 82 and remaining resist coating 84 at step 92, baking of the substrate 82, resist coating 84, and polymer reflow material 86 at step 94, and rinsing the template at step 96.

In particular, in one embodiment the reactive ion etch (RIE) performed at step 90 includes a 5 to 20 second application of oxygen O2 to clear any residual resist coating 84 located in the bottom portion of a developed area. At step 92, polymer reflow material 86, such as 200 nanometer thick Polymer Reflow material FSC-8000GM, is applied to the surface of resist coating 84. At step 94, polymer reflow material 86 is baked, in one example at 130° Celsius (C) for sixty seconds, to cause the evaporation of water out of the top coating material, which induces the resist coating to reflow, thereby reducing the circumferential diameter (CD) of each bit-patterned hole location while increasing the distance between each successive bit-patterned location. Depending on the embodiment, the time and temperate associated with the bake process is controlled in order to control the CD of each of the bit-island locations and the distance between each of the bit-islands. At step 96, shrink material 86 is removed in a rinse step. As shown at step 96, the circumferential diameter of a hole representing a bit-island is labeled $d_1$, wherein $d_1$ is smaller than $d_0$ (i.e., the result of the process is the shrinking of the circumferential diameter of each holes, which results in smaller bit-islands).

In addition to varying the bake temperature and time to control the final size and pitch of the bit-islands, the steps making up the post-development treatment process may be performed a number of times as desired to achieve the targeted resist pattern. That is, the circumferential diameter of each hole can be controlled by selectively repeating the process described with respect to FIG. 6. In the embodiment shown in FIG. 6, a polymer reflow material is used to aid in the inducement of reflow in the resist coating. However, in other embodiments the inducement of reflow in the resist coating may be accomplished without the presence of a thermal reflow layer. In addition, it should also be noted that the embodiment shown in FIG. 6 is directed towards fabrication of the template or mold used in subsequent steps to form the actual bit-patterned media or similar device. However, the process described with respect to FIG. 6 could also be applied to the bit-patterned media directly to induce reflow of the bit-patterned media such that the circumferential diameter of each bit-island can be controlled as desired using this process.

The template generated as a result of one or more of the process steps described with respect to FIGS. 3-6 is used to transfer the pattern formed in the resist coating to a magnetic media, and in fact may be used to replicate tens of thousands of discs. In one embodiment, the pattern formed on the template is transferred to a magnetic media using a nanoimprinting technology (NIL). For instance, the pattern may be transferred by using an etch and ion milling process by which material is removed from the magnetic media based on the template pattern, or a plating process in which material is added to the magnetic media based on the template pattern. In other embodiment, other well-known methods of transferring the pattern from the template to a magnetic media may be employed. In this way, a magnetic media is formed having arrays of isolated magnetic bit-islands that include the uniformity in size and shape, as well as desired size and pitch that results in a high-quality magnetic media.

Although the present invention has been described with reference to preferred embodiments, workers skilled in the art will recognize that changes may be made in form and detail without departing from the spirit and scope of the invention. In particular, this description has described most embodiments with respect to bit-island formation as it is used in bit-patterned media, although the techniques described could be applied to any number of lithographic processes, and in particular any lithographic process in which high-resolution dots or line patterning are required.

The invention claimed is:

1. A method comprising:
   applying a resist coating to a substrate;
   exposing a selected location of the resist coating to an energy source in a plurality of successive exposures, each successive exposure of the selected location separated by an interval of time, the plurality of successive exposures providing a time-averaged exposure of the selected location; and
   rotating the resist coating after individual exposures of the plurality of successive exposures.

2. The method of claim 1, wherein the energy source comprises one of an electron beam energy source, a nano-imprint energy source, a deep ultraviolet energy source (DUV), and extreme ultraviolet (EUV) energy source, and an ion-beam energy source.

3. The method of claim 1, wherein the interval of time between successive exposures of the selected location to the energy source is larger than a writing time associated with each successive exposure of the selected locations.

4. A method comprising:
   applying a resist coating to a substrate;
   exposing selected locations of the resist coating to an energy source;
   rotating the resist coating between each exposure of a time-averaged exposure of the resist coating; and
   applying a development solution to the resist coating having a development rate wherein fully exposed regions of the resist coating are developed while leaving undeveloped partially exposed regions and unexposed regions of the resist coating.

5. The method of claim 4, further comprising controlling the development rate by applying the development solution to the resist coating at a selected temperature and a selected time.

6. The method of claim 4, wherein the resist coating is a positive electron resist coating and the development solution is a weak solvent that develops fully exposed resist coatings without developing partially exposed resist coatings.

7. The method of claim 6, wherein the development solution is selected from the group consisting of water, isopropanol, ethanol, and methanol and combinations thereof.

8. The method of claim 4 further comprising:
inducing crosslinking of polymer chains in the partially exposed regions of the negative electron resist coating, prior to applying the development solution to the negative electron resist coating.

9. The method of claim 8, wherein inducing cross-linking of polymer chains is performed by one selected from a group comprising: photochemistry, an electric field, and a magnetic field.

10. A method comprising:
applying a negative electron resist coating to a substrate;
exposing selected locations of the negative electron resist coating to an energy source;
rotating the negative electron resist coating between each exposure of a time-averaged exposure of the resist coating; and
applying a strong solvent development solution to the negative electron resist coating having a development rate wherein partially exposed regions of the negative electron resist coating are developed while leaving undeveloped fully exposed regions and unexposed regions of the negative electron resist coating.

11. The method of claim 10, wherein the development solution is selected from the group consisting of KOH, NaOH, and high-concentration TMAH aqueous solution and combination thereof.

12. A method comprising:
applying a resist coating polymer to a surface of a substrate;
exposing selected portions of the resist coating polymer to an energy source in a plurality of successive exposures, each successive exposure of the selected location separated by an interval of time, the plurality of successive exposures providing a time-averaged exposure of the selected locations;
rotating the resist coating after individual successive exposures;
developing the resist coating polymer using a selective development solution that only develops fully exposed areas of the resist coating polymer, wherein the developing only the fully exposed areas of the resist coating polymer results in the formation of well-defined holes in a developed resist coating polymer;
baking the developed resist coating polymer to induce reflow of the developed resist coating polymer in a plurality of bakes wherein a circumferential diameter associated with the holes is reduced to a predetermined distance;
rinsing the polymer reflow material from the substrate; and
transferring the resist pattern defined by the remaining resist coating polymer to a bit-island magnetic medium.

13. The method of claim 12, wherein an electron beam energy source is used to expose the selected portions of the resist coating polymer.

14. The method of claim 12, wherein the interval of time between successive exposure of a selected location to the energy source is greater than the exposure time associated with each exposure of the selected location to the energy source to provide a time-averaged exposure of the selected location that substantially minimizes noise associated with the energy source.

15. The method of claim 12, wherein developing the resist coating polymer using a selective development solution comprises:
applying a development solution that develops areas fully exposed by the energy source but does not develop partially exposed areas corresponding to noise associated with the energy source based; and
controlling a temperature of the selected development solution wherein application of the development solution to the resist coating at the temperature results in a development rate that develops fully exposed areas of the resist coating but not partially exposed areas of the resist coating.

16. The method of claim 12, further comprising:
applying a polymer reflow material to the developed resist coating polymer.

17. The method of claim 12 further comprising:
increasing a differentiation between a chemical composition of the fully exposed areas of the resist coating polymer as compared to a chemical composition of partially exposed areas of the resist coating polymer.

18. The method of claim 17, wherein the increasing the differentiation between the chemical composition of the fully exposed areas and partially exposed areas comprises inducing cross-linking of polymer chains in the partially exposed areas.

* * * * *